(12) United States Patent
Kobayashi

(10) Patent No.: US 7,498,677 B2
(45) Date of Patent: Mar. 3, 2009

(54) SEMICONDUCTOR DEVICE

(75) Inventor: Kenji Kobayashi, Osaka (JP)

(73) Assignee: Panasonic Corporation, Osaka (JP)

( * ) Notice: Subject to any disclaimer, the term of this patent is extended or adjusted under 35 U.S.C. 154(b) by 306 days.

(21) Appl. No.: 11/249,441

(22) Filed: Oct. 14, 2005

(65) Prior Publication Data

US 2006/0081987 A1   Apr. 20, 2006

(30) Foreign Application Priority Data

Oct. 15, 2004   (JP)   ............................. 2004-301171

(51) Int. Cl.
*H01L 23/485*   (2006.01)
(52) U.S. Cl. ............... 257/760; 257/758; 257/E21.577; 438/628
(58) Field of Classification Search ............... 257/758, 257/760
See application file for complete search history.

(56) References Cited

U.S. PATENT DOCUMENTS

| 6,187,672 | B1 * | 2/2001 | Zhao et al. ................... 438/639 |
| 6,943,414 | B2 * | 9/2005 | Kar Roy et al. ............. 257/379 |
| 2002/0027287 | A1 * | 3/2002 | Takagi et al. ................. 257/758 |
| 2002/0130418 | A1 * | 9/2002 | Liu et al. ..................... 257/760 |
| 2005/0116348 | A1 * | 6/2005 | Minamihaba et al. ....... 257/758 |

FOREIGN PATENT DOCUMENTS

JP   2003-309174   10/2003

* cited by examiner

*Primary Examiner*—Jerome Jackson, Jr.
*Assistant Examiner*—Paul A Budd
(74) *Attorney, Agent, or Firm*—McDermott Will & Emery LLP

(57) ABSTRACT

A semiconductor device has a first interlayer insulating film formed on a substrate, having a first interconnection buried therein, and having a depressed portion and an insulating barrier film formed on the first interlayer insulating film. A second interlayer insulating film is formed to fill in the depressed portion, cover the upper surface of the insulating barrier film, and have a second interconnection buried therein.

16 Claims, 9 Drawing Sheets

SEMICONDUCTOR DEVICE

CROSS-REFERENCE TO RELATED APPLICATIONS

The teachings of Japanese Patent Application JP 2004-301171, filed Oct. 15, 2004, are entirely incorporated herein by reference, inclusive of the specification, drawings, and claims.

BACKGROUND OF THE INVENTION

The present invention relates to a semiconductor device and to a method for fabricating the same. More particularly, it relates to a semiconductor device using copper interconnections and low dielectric constant films and to a method for fabricating the same.

With the recent trends toward the higher integration and smaller chip size of a semiconductor integrated circuit, the provision of miniaturized and multilayered interconnections has been promoted. A reduction in the spacing between the interconnections increases an interconnection resistance and a capacitance between the interconnections so that a signal delay resulting from the interconnection resistance and the capacitance between the interconnections becomes no more negligible. To pursue the miniaturization of the semiconductor integrated circuit, therefore, it is necessary to reduce a parasitic capacitance occurring between the interconnections. To reduce the parasitic capacitance between the interconnections, it is necessary to reduce the resistivity of each of the interconnections or the specific dielectric constant of an interlayer insulating film.

In a 0.13 μm gate length device, the replacement of an aluminum (Al) interconnection with a copper (Cu) interconnection formed by using a damascene process has been undertaken to reduce the resistivity of the interconnection. The use of the Cu interconnection formed by using the damascene process can reduce the resistivity of the interconnections to a level corresponding to about ⅔ of that of the conventionally used interconnection. In the Cu interconnection, however, Cu atoms are diffused rapidly into an insulating film, such as a silicon oxide film ($SiO_2$ film), so that the Cu atoms has the possibility of entering a transistor and causing the breakdown of the transistor. When the Cu atoms are diffused into a space between the interconnections and an unexpected cross-linked structure is formed therein, the phenomenon of an undesirable lowering of the breakdown voltage between the interconnections or the like may occur. Therefore, it is necessary to provide a barrier film for preventing the diffusion of the Cu atoms around a Cu film in the Cu interconnection.

To compose a barrier film, it is common practice to use a conductive barrier film (hereinafter referred to as a barrier metal film) made of tungsten nitride (WN), tantalum nitride (TaN), or titanium nitride (TiN) and covering the bottom and side surfaces of the Cu film and an insulating barrier film made of silicon nitride (SiN), silicon carbide (SiC), or the like and covering the upper surface of the Cu interconnection. Since a Cu interconnection is more difficult to form by an etching process than an Al interconnection, the formation of the Cu interconnection has been performed by a damascene process.

On the other hand, the replacement of a $SiO_2$ (with a specific dielectric constant of 4.2) film with a fluorine-containing silicon oxide film (with a specific dielectric constant of 3.7) has been undertaken to reduce the specific dielectric constant. In a 90 nm device or later, an insulating film (low dielectric constant film) with a specific dielectric constant lower than that of the fluorine-containing silicon oxide film is needed so that the use of a carbon-containing silicon oxide film, a coating-type organic polymer, or the like having a specific dielectric constant reduced by substituting the terminal of silicon in a $SiO_2$ film with an alkyl group (e.g., —$CH_3$ group) and providing porous and lower-density $SiO_2$ has been examined. An example of a semiconductor device using a Cu interconnection and a low dielectric constant film and a fabrication method therefor is disclosed in, e.g., Japanese Laid-Open Patent Publication No. 2003-309174.

SUMMARY OF THE INVENTION

However, a conventional semiconductor device using a Cu interconnection and a low dielectric constant film has the following problems.

A low dielectric constant film typically has a porous film structure so that the mechanical strength thereof is not sufficient. Accordingly, an insulating barrier film and a cap film are provided on the lower and upper surfaces of the low dielectric constant film, respectively, in the conventional semiconductor device using a low dielectric constant film, thereby increasing the process controllability of the insulating film. In the semiconductor device using the low dielectric constant film as an interlayer insulating film, therefore, a multilayer structure of insulating films composed of insulating barrier films, interlayer insulating films, and cap films deposited in multiple layers is formed so that a large number of interfaces are formed between the various insulating films.

Since the low dielectric constant film is a hydrophobic film and the insulating barrier film is a hydrophilic film, the adherence between the low dielectric constant film and the insulating barrier film at the interface thereof is low. On the other hand, the formation of Cu interconnections includes a large number of polishing steps so that a horizontal force is applied to the multilayer structure of the insulating films during polishing. Accordingly, the conventional semiconductor device using the low dielectric constant film has the problem that the displacement of the multilayered insulating films is likely to occur during the formation of the Cu interconnections.

In addition, because the low dielectric constant film typically has a high thermal expansion coefficient and the insulating barrier film typically has a low thermal expansion coefficient, the problem is encountered that the interlayer insulating film expands as a result of annealing after the deposition of the low dielectric constant film, annealing after the etching of the insulating barrier film, and the like and therefore the multilayered insulating films are likely to incur delamination. In the case where film displacement or film delamination has occurred, a metal film is buried in the portion where film displacement or film delamination has occurred to cause a faulty interconnection such as a short circuit between the interconnections.

It is therefore an object of the present invention is to solve the conventional problems described above and provide a semiconductor device using a Cu interconnection and a low dielectric constant film which is less likely to incur a faulty interconnection, such as a short circuit between interconnections, resulting from the displacement of multilayered insulating films or film delamination and a method for fabricating the same.

To attain the object, the semiconductor device according to the present invention is constituted such that a first interlayer insulating film has a depressed portion filled with a second interlayer insulating film.

Specifically, the semiconductor device according to the present invention comprises: a first interlayer insulating film formed on a substrate, having a first interconnection buried therein, and having a depressed portion; an insulating barrier film formed on the first interlayer insulating film; and a second interlayer insulating film formed to fill in the depressed portion and cover the insulating barrier film and having a second interconnection buried therein.

Since the semiconductor device according to the present invention provides an increased adherence between the first and the second interlayer insulating films, the displacement of the films due to a horizontal stress occurring in a CMP step or the like can be suppressed. Accordingly, it becomes possible to suppress the occurrence of a faulty interconnection such as a short circuit between the interconnections and implement a semiconductor device with high reliability.

In the semiconductor device according to the present invention, the second interlayer insulating film filled in the depressed portion is preferably in contact with the first interlayer insulating film at a bottom surface of the depressed portion and at a sidewall thereof. The arrangement brings the first and second interlayer insulating films which have substantially equal thermal expansion coefficients into contact with each other at the side and bottom surfaces of the depressed portion. Accordingly, it becomes possible to suppress film delamination resulting from the different thermal expansion coefficients of the first and second interlayer insulating films and the insulating barrier film.

In the semiconductor device according to the present invention, the insulating barrier film is preferably formed to have a portion thereof overhanging the depressed portion and the portion of the insulating barrier film formed to overhang the depressed portion preferably has upper and lower surfaces thereof in contact with the second interlayer insulating film. In the arrangement, the second interlayer insulating film sandwiches the insulating barrier film so that it becomes possible to suppress film delamination.

In the semiconductor device according to the present invention, the depressed portion preferably has an upper end portion wider than the bottom surface thereof. In the arrangement, the contact area between the first and second interlayer insulating films is increased to suppress the displacement of the films.

In the semiconductor device according to the present invention, the insulating barrier film is preferably formed to cover a bottom surface of the depressed portion and a sidewall thereof. The arrangement allows an increase in the strength of the portion where the second interlayer insulating film is buried in the first interlayer insulating film.

The semiconductor device according to the present invention preferably further comprises: a via plug for providing an electrical connection between the first and second interconnections.

In the semiconductor device according to the present invention, each of the first and second interlayer insulating films is preferably a low dielectric constant film.

In the semiconductor device according to the present invention, at least one of the first and second interlayer insulating films is preferably a multilayer film composed of a plurality of films, including a low dielectric constant film, which are stacked in layers.

In the semiconductor device according to the present invention, each of the first and second interconnections is preferably composed of a barrier metal film and a copper film.

A method for fabricating a semiconductor device according to the present invention comprises the steps of: (a) forming a first interlayer insulating film on a substrate and then burying a first interconnection in the formed first interlayer insulating film; (b) depositing an insulating barrier film on the first interlayer insulating film; (c) performing etching with respect to the first interlayer insulating film to form a depressed portion in the first interlayer insulating film; (d) depositing a second interlayer insulating film to fill in the depressed portion and cover the insulating barrier film; and (e) burying a second interconnection connected electrically to the first interconnection in the second interlayer insulating film.

Since the method for fabricating a semiconductor device according to the present invention provides an increased adherence between the first and the second interlayer insulating films, the displacement of the films due to a horizontal stress occurring in a CMP step or the like can be suppressed. Accordingly, it becomes possible to suppress the occurrence of a faulty interconnection such as a short circuit between the interconnections and fabricate a semiconductor device with high reliability.

In the method for fabricating a semiconductor device according to the present invention, the step (c) is preferably performed after the step (b) and preferably includes the step of etching the insulating barrier film.

In this case, in the step (c), the insulating barrier film is preferably etched by using a dry etching process in which an etching rate is higher for the insulating barrier film than for the first interlayer insulating film and the first interlayer insulating film is preferably etched by using a wet etching process in which the etching rate is higher for the first interlayer insulating film than for the insulating barrier film such that the insulating barrier film is formed to have a portion overhanging the depressed portion and the depressed portion is formed to have a configuration which is wider at an upper end portion thereof than at a bottom surface thereof. The arrangement allows the formation of the downwardly tapered depressed portion and reliable formation of a structure in which the insulating barrier film is sandwiched by the second interlayer insulating film.

In this case, in the step (d), the second interlayer insulating film is preferably filled in a space under the portion of the insulating barrier film overhanging the depressed portion.

In the method for fabricating a semiconductor device according to the present invention, the step (b) is preferably performed after the step (c) to cover a bottom surface of the depressed portion and a sidewall thereof with the insulating barrier film.

In the method for fabricating a semiconductor device according to the present invention, the step (e) preferably includes the step of forming a via plug for providing an electrical connection between the first and second interconnections.

In the method for fabricating a semiconductor device according to the present invention, each of the first and second interlayer insulating films is preferably a low dielectric constant film.

In the method for fabricating a semiconductor device according to the present invention, each of the first and second interconnections is preferably composed of a barrier metal film and a copper film.

DETAILED DESCRIPTION OF THE INVENTION

Embodiment 1

Figure 1:
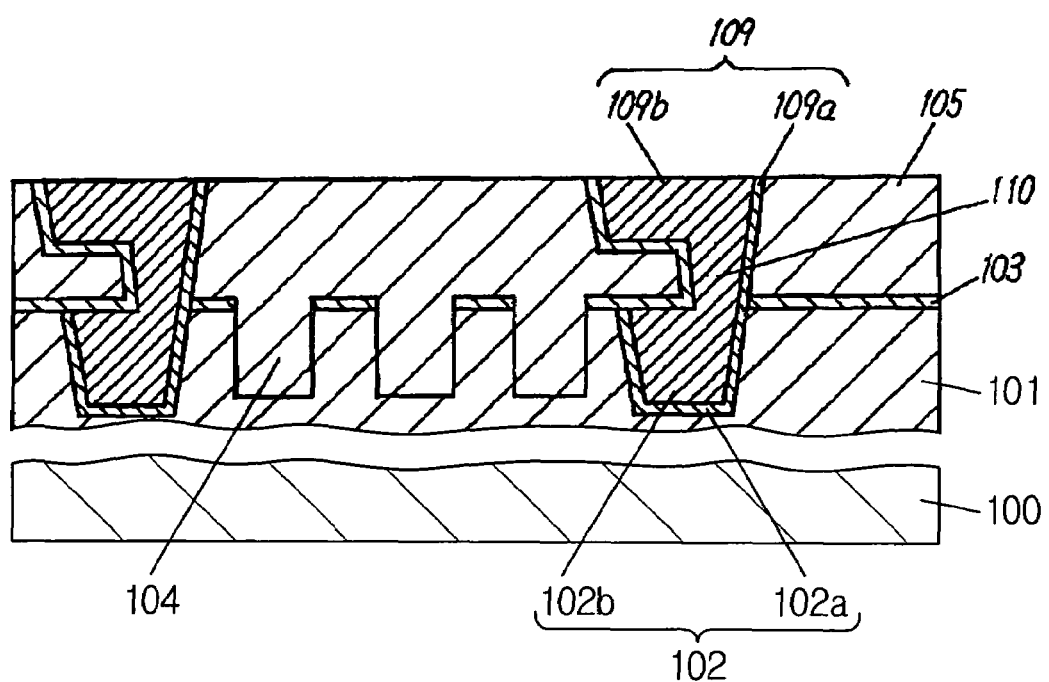
FIG. 1 is a cross-sectional view of a semiconductor device according to a first embodiment of the present invention.

A semiconductor device according to a first embodiment of the present invention and a method for fabricating the same will be described with reference to the drawings. FIG. 1 shows a cross-sectional structure of the semiconductor device according to the first embodiment.

As shown in FIG. 1, the semiconductor device according to the first embodiment comprises: a first interlayer insulating film 101; an insulating barrier film 103; and a second interlayer insulating film 105 which are formed successively on a semiconductor substrate 100. In the first interlayer insulating film 101, first interconnections 102 each composed of a barrier metal film 102a and a copper (Cu) film 102b are buried. The insulating barrier film 103 for preventing the diffusion of Cu is deposited over the first interconnections 102 and the first interlayer insulating film 101. Depressed portions 104 are formed by selectively removing the respective portions of the first interlayer insulating film 101 and the insulating barrier film 103. The second interlayer insulating film 105 is deposited to fill in the depressed portions 104. In the second interlayer insulating film 105, second interconnections 109 each composed of a barrier metal film 109a and a Cu film 109b are buried. The second interconnections 109 and the first interconnections 102 are connected electrically to each other by via plugs 110.

In the semiconductor device according to the first embodiment, the second interlayer insulating film 105 is filled in the depressed portions 104 formed in the first interlayer insulating film so that the interface between the first and second interlayer insulating films 101 and 105 is formed in a three-dimensional manner. This increases the adherence between the first and second interlayer insulating films 101 and 105 and thereby suppresses the occurrence of the displacement of the multilayered insulating films due to a horizontal stress occurring in the step of chemical mechanical polishing (CMP) or the like.

Specifically, the second interlayer insulating film 105 filled in the depressed portions 104 formed in the first interlayer insulating film 101 serves as a vertically protruding stopper capable of suppressing the horizontal displacement of the first and second interlayer insulating films 101 and 105. As a result, it becomes possible to form a semiconductor device which is resistant to a horizontal stress and less likely to incur film displacement.

Since the first and second interlayer insulating films 101 and 105 which have substantially equal thermal expansion coefficients are in contact with each other at the bottom surfaces and sidewalls of the depressed portions 104, film delamination resulting from the different thermal expansion coefficients of the first and second interlayer insulating films 101 and 105 and the insulating barrier film 103 can be suppressed.

Thus, in the semiconductor device according to the present embodiment, the occurrence of the displacement of the multilayered insulating films and the delamination of the insulating films can be suppressed and the occurrence of a faulty interconnection such as a short circuit between the interconnections resulting from film displacement and film delamination can be suppressed.

FIGS. 2A to 2D and FIGS. 3A to 3D show the cross-sectional structures of the semiconductor device according to the first embodiment in the individual steps of a fabrication method therefor.

Figure 2A:
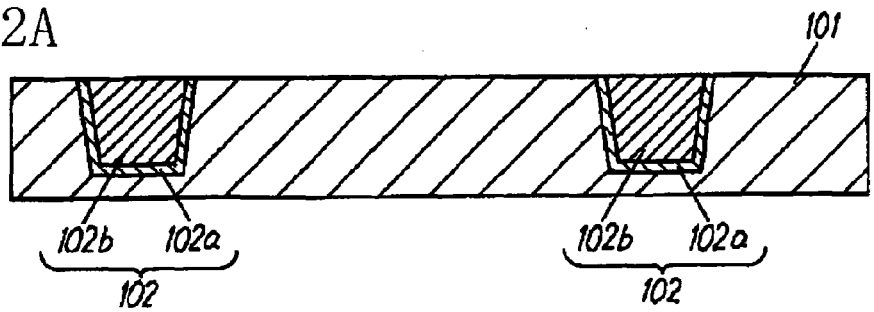
FIGS. 2A to 2D are cross-sectional views illustrating the individual steps of fabricating the semiconductor device according to the first embodiment in the order they are performed.

First, as shown in FIG. 2A, a cap film (not shown) composed of, e.g., a $SiO_2$ film is formed on the first interlayer insulating film 101 composed of a carbon-containing silicon oxide film formed on the semiconductor substrate (not shown). Then, a resist pattern (not shown) having a first interconnection trench pattern is formed by photolithography. Subsequently, dry etching is performed with respect to the cap film and the first interlayer insulating film 101 by using the resist pattern as a mask, thereby forming first interconnection trenches. Then, a multilayer film composed of Ta and TaN (Ta/TaN multilayer film), which is to serve as a barrier metal film 102a, and a Cu seed film (not shown) are deposited successively by sputtering over the cap film to cover the first interconnection trenches. Subsequently, a Cu-film forming film 102b is deposited by electrolytic plating on the Cu seed film in such a manner as to completely fill in the first interconnection trenches. Thereafter, the portions of the Ta/TaN multilayer film and Cu (including the Cu seed film) which are located outside the first interconnection trenches are removed by CMP so that the first interconnections 102 each composed of the barrier film 102a and the Cu film 102b are formed.

Figure 2B:
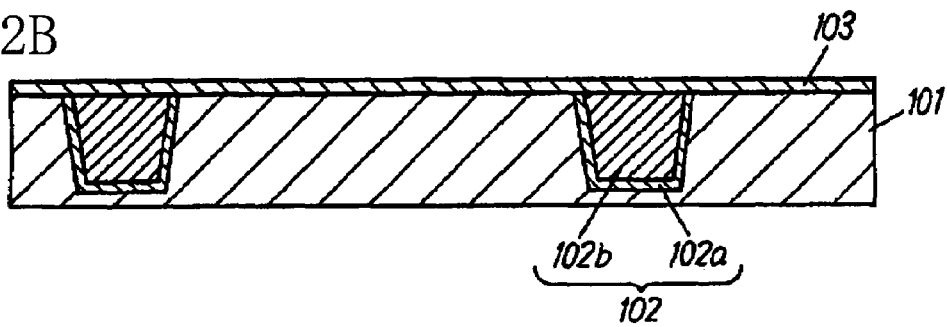

Next, as shown in FIG. 2B, the insulating barrier film 103 composed of, e.g., a SiC film with a thickness of 50 nm, which is for preventing the diffusion of Cu, is deposited on the first interlayer insulating film 101 including the first interconnections 102.

Figure 2C:
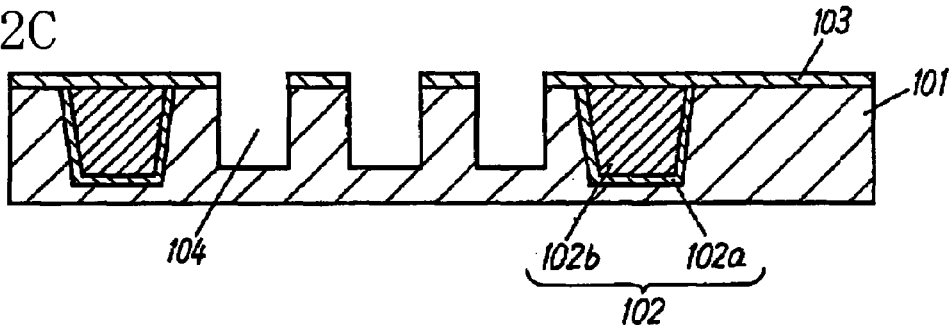

Next, as shown in FIG. 2C, a resist pattern (not shown) having a width of, e.g., 0.09 µm to 5 µm and a spacing of 0.09 µm to 5 µm is formed by photolithography on the first interlayer insulating film 101. Then, by using the resist pattern as a mask, only the insulating barrier film 103 is selectively etched by an anisotropic dry etching process exhibiting a higher selectivity to the insulating barrier film 103 than to the first interlayer insulating film 101. Thereafter, by using the insulating barrier film 103 as a hard mask, only the first interlayer insulating film 101 is selectively etched by an anisotropic dry etching process exhibiting a higher selectivity to the first insulating film 101 than to the insulating barrier film 103, thereby forming the depressed portions 104 each at a depth of, e.g., 250 nm. During the formation of the depressed portions 104, the first interconnections 102 are protected from being exposed at the sidewall portions of the depressed portions 104.

Figure 2D:
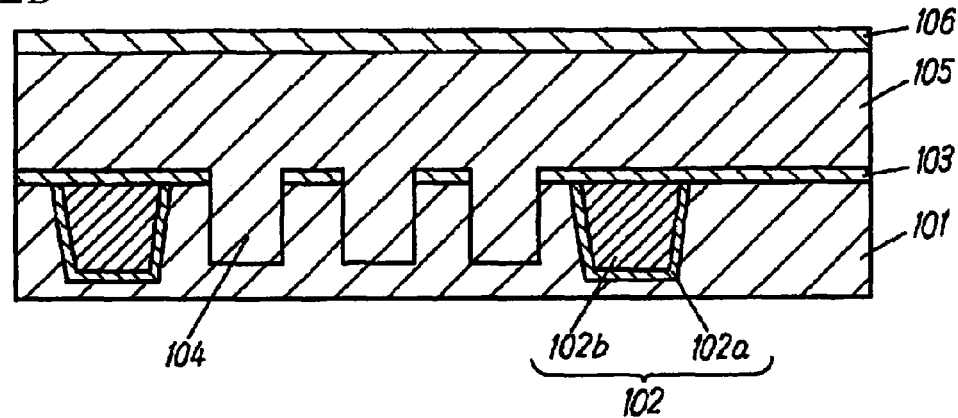

Next, as shown in FIG. 2D, the second interlayer insulating film 105 composed of, e.g., a carbon-containing silicon oxide film is deposited to a thickness of about 1000 nm on the insulating barrier film 103 to fill in the depressed portions 104. Then, the second interlayer insulating film 105 is polished by CMP by a thickness of about 400 nm to be planarized such that a level difference resulting from the depressed portions 104 is reduced. Thereafter, a cap film 106 composed of, e.g., a $SiO_2$ film with a thickness of 50 nm is deposited on the second interlayer insulating film 105. As will be described later, the cap film 106 is removed by polishing performed by CMP.

Figure 3A:
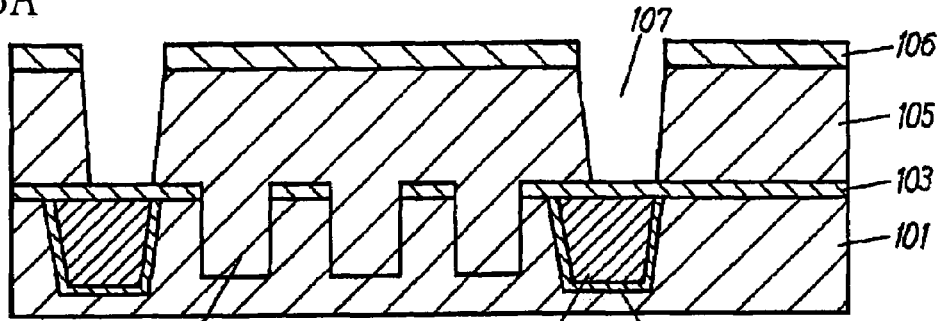
FIGS. 3A to 3D are cross-sectional views illustrating the individual steps of fabricating the semiconductor device according to the first embodiment in the order they are performed.

Next, as shown in FIG. 3A, a resist pattern (not shown) having a via hole pattern providing connections between the first and second interconnections 102 and 109 is formed by photolithography. Then, by using the resist pattern as a mask, dry etching is performed with respect to the cap film 106 and the second interlayer insulating film 105, thereby forming via holes 107.

Figure 3B:
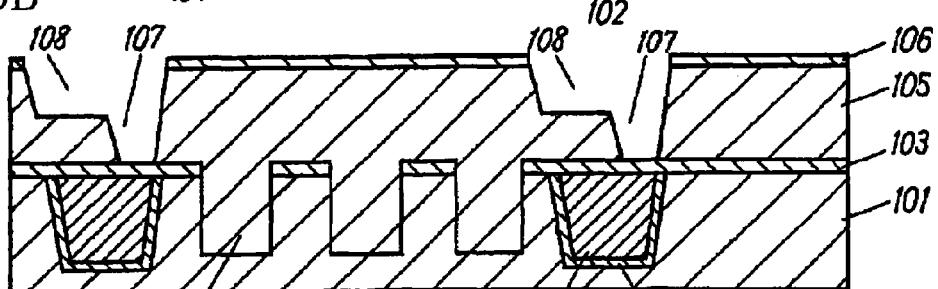

Next, as shown in FIG. 3B, second interconnection trenches 108 are formed in the upper portion of the second interlayer insulating film 105 including regions formed with the via holes 107 by photolithographic and dry etching processes at the same time as the formation of the via holes 107.

Figure 3C:
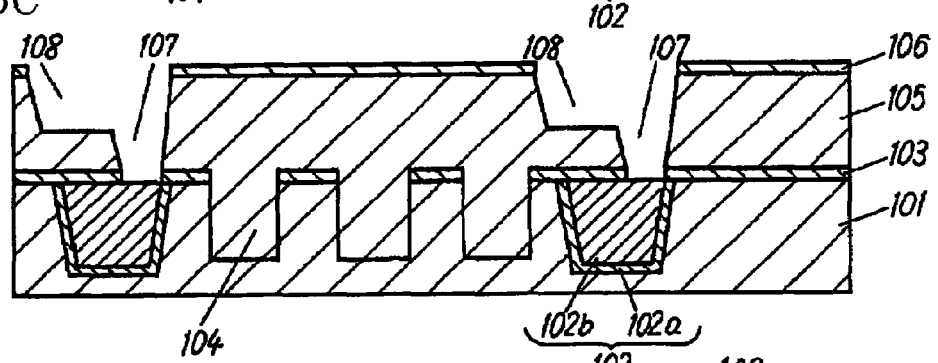

Next, as shown in FIG. 3C, an etch-back process is performed by dry etching using a gas mixture of, e.g., $CF_4$ gas and $N_2$ gas with respect to the entire surface of a semiconductor substrate, thereby partially removing the insulating barrier film 103 such that the via holes 107 reach the first interconnections 102.

Figure 3D:
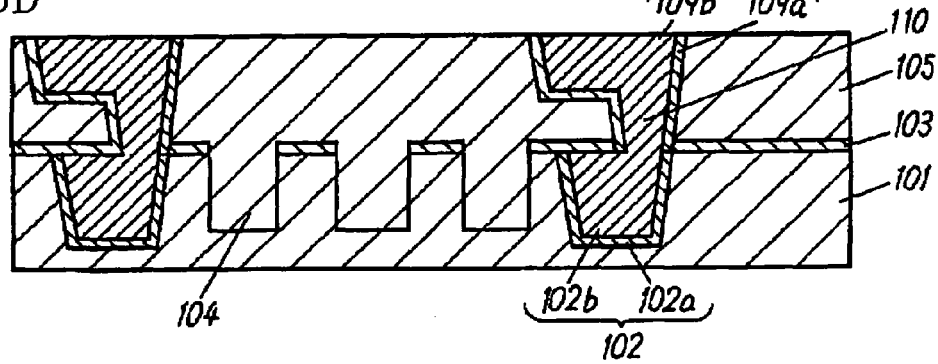

Next, as shown in FIG. 3D, the Ta/TaN multilayer film serving as a barrier metal film and the Cu seed film (not shown) are deposited successively by sputtering over the cap film 106 and the second interlayer insulating film 105 to cover the via holes 107 and the second interconnection trenches 108. Subsequently, the Cu-film forming film 109b is deposited on the Cu seed film by electrolytic plating in such a manner as to completely fill in the via holes 107 and the second interconnection trenches 108. Thereafter, the cap film 106 and the respective portions of the Ta/TaN multilayer film and the Cu-film forming film (including the Cu seed film) which are located outside the second interconnection trenches 108 are removed by CMP so that the second interconnections 109 composed of the barrier metal film 109a and the Cu film 109b are formed. As a result, the via plug portions 110 providing the electrical connections between the second and first interconnections 109 and 102 are formed. The barrier metal film 109a formed on the lower surface and side surfaces of the Cu film 109b filled in the via holes 107 and the second interconnection trenches 108 functions as a layer for preventing the diffusion of Cu atoms.

By repeatedly performing the individual steps described above, a semiconductor device having Cu interconnections and low dielectric constant films in a multilayer structure is obtained.

Although the first embodiment has shown the width and spacing of the resist pattern for forming the depressed portions 104 and the depth of each of the depressed portions 104, they are not particularly limited and may also be varied for each of the layers. Although the first embodiment has used Cu as the material of each of the first and second interconnections 102 and 109, the type of the material of the interconnection is not particularly limited. Instead of Cu, it is also possible to use, e.g., Cu, Ag, Al, an alloy thereof, or the like. Although the first embodiment has used the Ta/TaN multilayer film as each of the barrier metal films 102a and 109a, the type of the barrier metal film is not particularly limited. Instead of the Ta/TaN multilayer film, it is also possible to use, e.g., a Ta film, a TaN film, a WN film, a TiN film, a multilayer film thereof, or the like. Although the first embodiment has used the SiC film as the insulating barrier film 103, the type of the insulating barrier film 103 is not particularly limited. Instead of the SiC film, it is also possible to use, e.g., a SiN film, SiCN film, a benzocyclobutene (BCB) film, a cobalt-tungsten film (CoWB) film, or the like.

Embodiment 2

Figure 4:
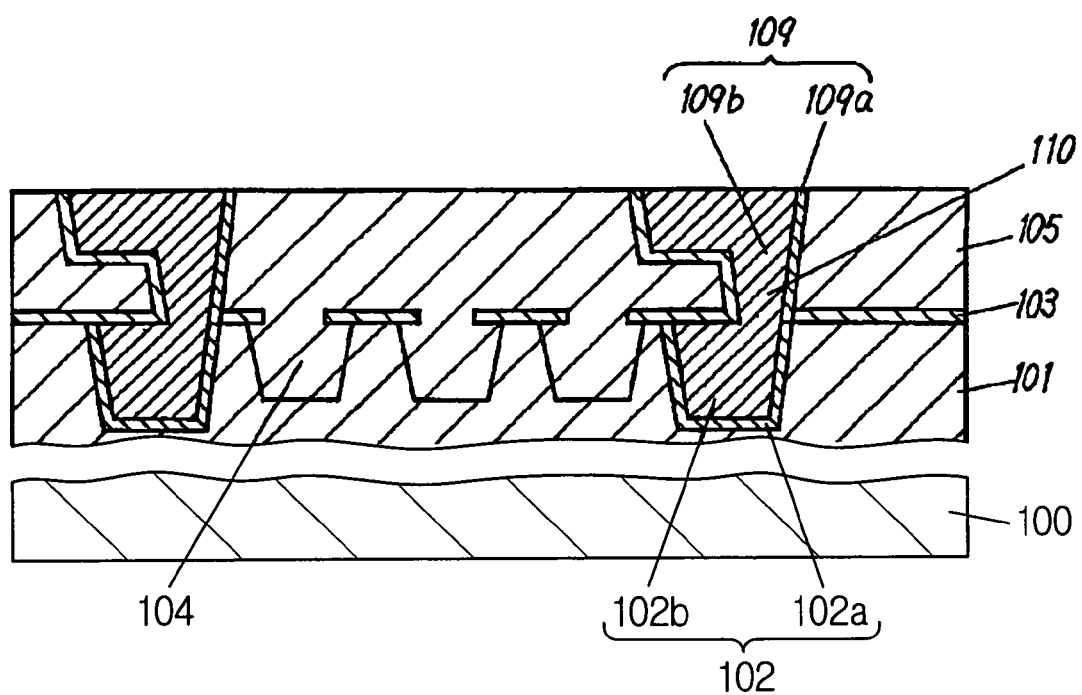
FIG. 4 is a cross-sectional view of a semiconductor device according to a second embodiment of the present invention.

A semiconductor device according to a second embodiment of the present invention and a method for fabricating the same will be described with reference to the drawings. FIG. 4 shows a cross-sectional structure of the semiconductor device according to the second embodiment. The description of the components shown in FIG. 4 which are the same as shown in FIG. 1 will be omitted by retaining the same reference numerals.

As shown in FIG. 4, the semiconductor device according to the second embodiment has the insulating barrier film 103 formed to overhang the depressed portions 104 and the second interlayer insulating film 105 is filled also in the space under the overhanging insulating barrier film 103.

Since the second interlayer insulating film 105 is thus formed to sandwich the insulating barrier film 103, the insulating barrier film 103 is caught by the second interlayer insulating film 105 so that effective suppression of film delamination is enabled.

In addition, the semiconductor device according to the second embodiment has the depressed portions 104 each of which is wider at the upper end portion thereof than at the bottom surface thereof so that the sidewalls of the depressed portions 104 are inclined to be upwardly widened. By inclining the sidewalls of the depressed portions 104 such that they are upwardly widened, the contact area between the first and second interlayer insulating films 101 and 105 can be increased. This further increases the portion of the interface between the first and second interlayer insulating films 101 and 105 which is formed in a three-dimensional manner. Accordingly, the adherence between the first and second interlayer insulating films 101 and 105 is increased to allow effective suppression of the occurrence of film displacement due to a horizontal stress occurring in the CMP step. In other words, the second interlayer insulating film 105 serves as a stopper protruding vertically into the first interlayer insulating film 101 so that a structure resistant to the horizontal stress is formed to suppress the displacement of the multilayered films. In the resulting structure, the first and second interlayer insulating films 101 and 105 which have substantially equal thermal expansion coefficients are in contact with each other to suppress film delamination resulting from the different thermal expansion coefficients of the interlayer insulating films and the insulating barrier film.

FIGS. 5A to 5D and FIGS. 6A to 6D show the cross-sectional structures of the semiconductor device according to the second embodiment in the individual steps of the fabrication method therefor. The description of the components shown in FIGS. 5A to 5D and FIGS. 6A to 6D which are the same as shown in FIGS. 2A to 2D and FIGS. 3A to 3D will be omitted by retaining the same reference numerals.

Figure 5A:
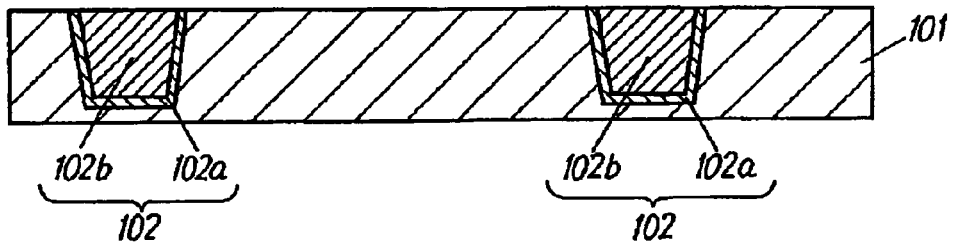
FIGS. 5A to 5D are cross-sectional views illustrating the individual steps of fabricating the semiconductor device according to the second embodiment in the order they are performed.
Figure 5B:
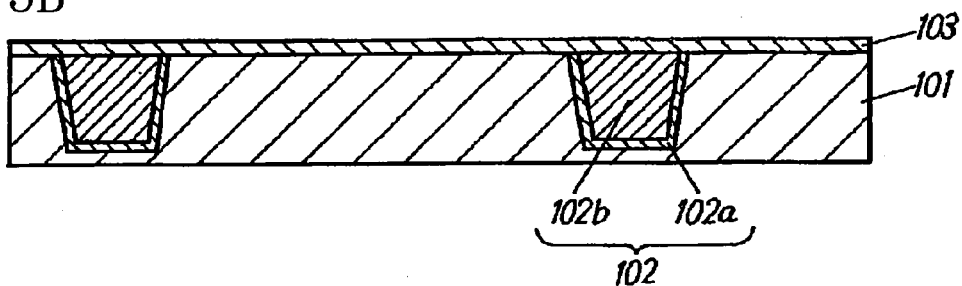

First, as shown in FIGS. 5A and 5B, the first interlayer insulating film 101 having the plurality of first interconnections 102 buried therein and the insulating barrier film 103 covering the first interlayer insulating film 101 and the first interconnections 102 are formed over the substrate (not shown) in the same manner as in the first embodiment.

Figure 5C:
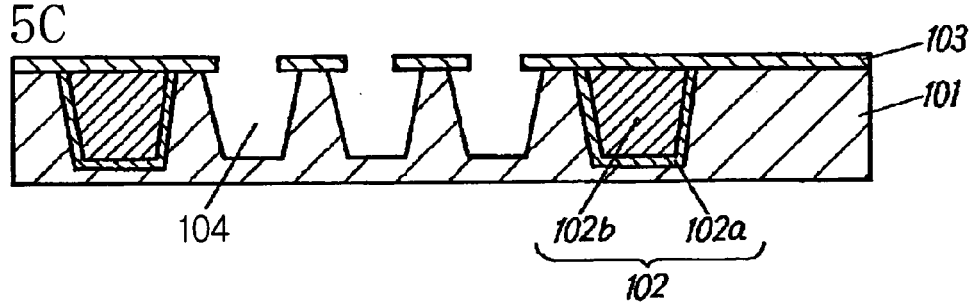

Next, as shown in FIG. 5C, a resist pattern (not shown) having a width of, e.g., 0.09 μm to 5 μm and a spacing of 0.09 μm to 5 μm is formed by photolithography on the first interlayer insulating film 101. Then, by using the resist pattern as a mask, only the insulating barrier film 103 is selectively etched by a dry etching process exhibiting a higher selectivity to the insulating barrier film 103 than to the first interlayer insulating film 101. Thereafter, by using the insulating barrier film 103 as a hard mask, only the first interlayer insulating film 101 is selectively etched by an isotropic wet etching process using an etchant solution having a higher selectivity to the first insulating film 101 than to the insulating barrier film 103, thereby forming the depressed portions 104 each at a depth of 250 nm.

By performing the isotropic wet etching process, the first interlayer insulating film 101 is etched not only in the direction of the depth thereof but also in the lateral direction so that a structure in which the insulating barrier film is overhanging the depressed portions 104 is formed successfully. In addition, there can also be formed a structure in which the upper end portion of each of the depressed portions 104 is wider than the bottom surface thereof and the sidewalls are inclined to be upwardly widened. In the case where an opening having a diameter of 0.09 μm is formed in the insulating barrier film 103 and the first interlayer insulating film 101 is etched by a thickness of 250 nm in the direction of the depth thereof, the diameter of the upper end portion of the depressed portion becomes about 500 nm and the diameter of the bottom surface of the depressed portion becomes about 90 nm.

Figure 5D:
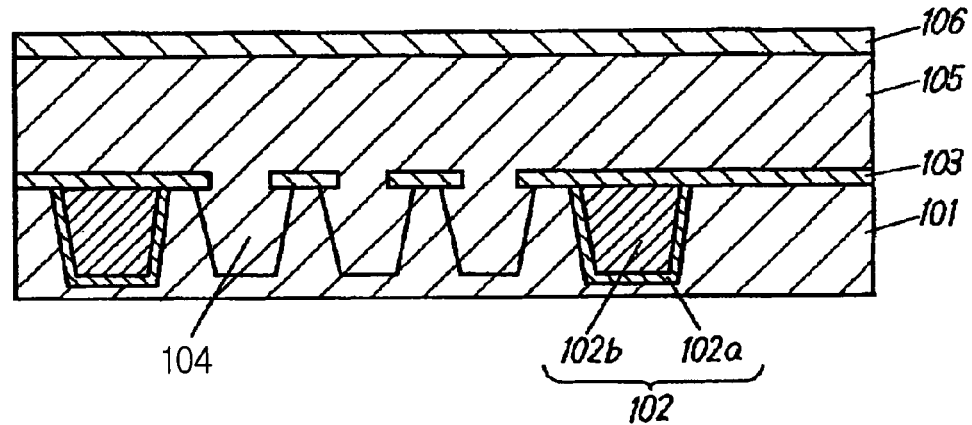
Figure 6A:
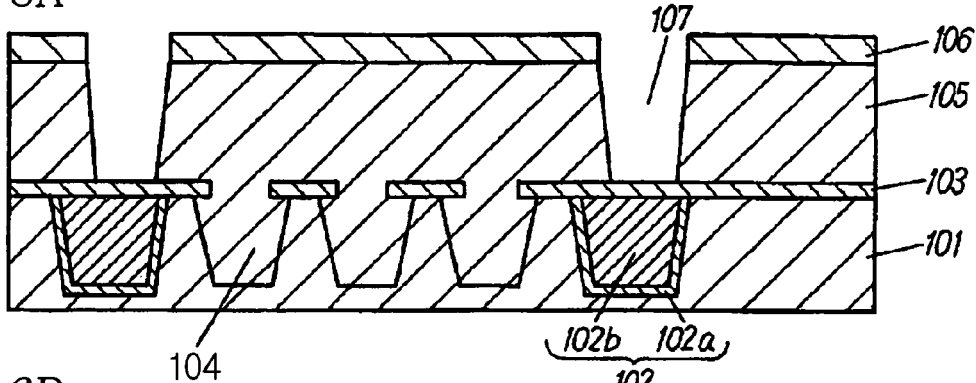
FIGS. 6A to 6D are cross-sectional views illustrating the individual steps of fabricating the semiconductor device according to the second embodiment in the order they are performed.
Figure 6B:
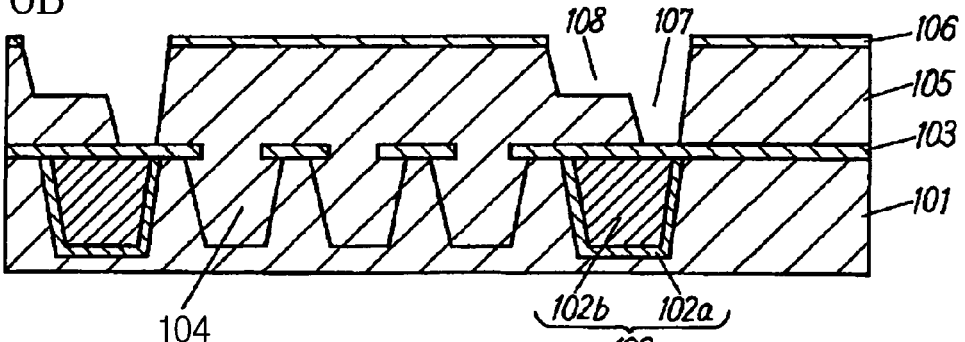
Figure 6C:
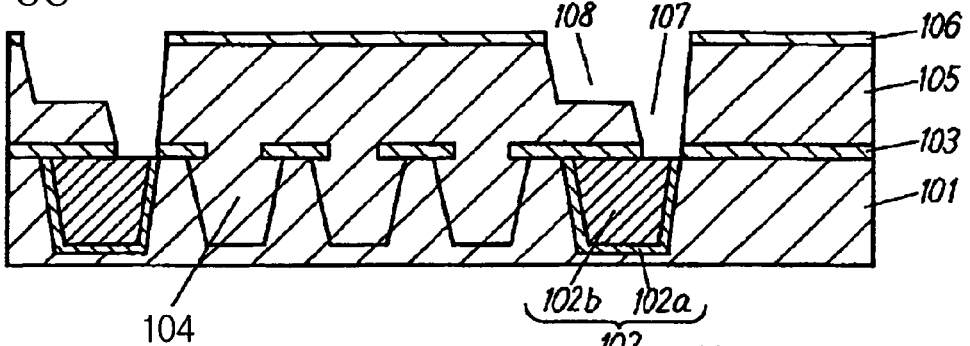
Figure 6D:
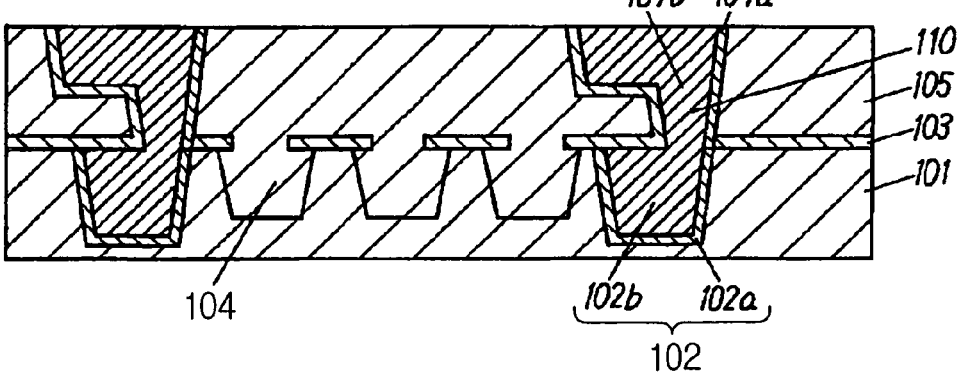

Next, as shown in FIG. 5D, the second interlayer insulating film 105 composed of, e.g., a carbon-containing silicon oxide film is deposited to a thickness of about 1000 nm to fill in the depressed portions 104 and cover the upper surface of the insulating barrier film 103. As a result, the second interlayer insulating film 105 is also filled in the space under each of the portions of the insulating barrier film 103 overhanging the depressed portions 104, thereby providing a structure in which the insulating barrier film 103 is sandwiched by the second interlayer insulating film 105. Subsequently, the second interlayer insulating film 105 is polished by CMP by a thickness of about 400 nm to be planarized such that a level difference resulting from the depressed portions 104 is reduced. Thereafter, the cap film 106 composed of, e.g., a $SiO_2$ film is deposited on the second interlayer insulating film 105 to have a thickness of, e.g., 50 nm. As will be described later, the cap film 106 is removed by polishing performed by CMP.

Next, as shown in FIGS. 6A to 6D, the second interconnections 109 and the via plugs 110 are formed in the same manner as in the first embodiment.

By repeatedly performing the individual steps described above, a semiconductor device having Cu interconnections and low dielectric constant films in a multilayer structure is obtained.

Although the second embodiment has shown the width and spacing of the resist pattern for forming the depressed portions 104, the depth of each of the depressed portions 104, and the widths of the upper and bottom surfaces of the depressed portion, they are not particularly limited and may also be varied for each of the layers. Although the second embodiment has used Cu as the material of each of the first and second interconnections 102 and 109, the type of the material of the interconnection is not particularly limited. Instead of Cu, it is also possible to use, e.g., Cu, Ag, Al, an alloy thereof, or the like. Although the second embodiment has used the Ta/TaN multilayer film as each of the barrier metal films 102a and 109a, the type of the barrier metal film is not particularly limited. Instead of the Ta/TaN multilayer film, it is also possible to use, e.g., a Ta film, a TaN film, a WN film, a TiN film, a multilayer film thereof, or the like. Although the second embodiment has used the SiC film as the insulating barrier film 103, the type of the insulating barrier film 103 is not particularly limited. Instead of the SiC film, it is also possible to use, e.g., a SiN film, a BCB film, a SiCN film, a CoWB film, or the like. Although the second embodiment has used the isotropic wet etching process as the method for forming the depressed portions 104 by etching the first insulating film 101, it is also possible to use an isotropic dry etching process exhibiting a higher selectivity to the first interlayer insulating film 101 than to the insulating barrier film 103.

Embodiment 3

Figure 7:
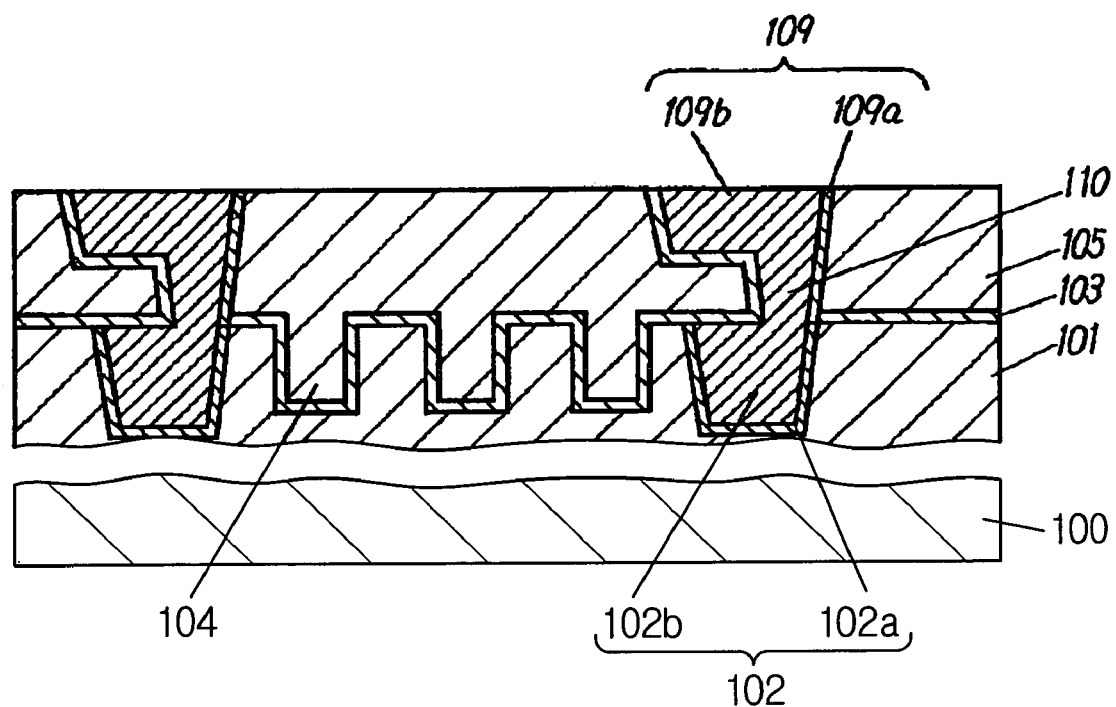
FIG. 7 is a cross-sectional view of a semiconductor device according to a third embodiment of the present invention.

A semiconductor device according to a third embodiment of the present invention and a method for fabricating the same will be described with reference to the drawings. FIG. 7 shows a cross-sectional structure of the semiconductor device according to the third embodiment. The description of the components shown in FIG. 7 which are the same as shown in FIG. 1 will be omitted by retaining the same reference numerals.

As shown in FIG. 7, the semiconductor device according to the third embodiment has the depressed portions 104 with the bottom surfaces and sidewalls thereof covered with the insulating barrier film 103.

In the semiconductor device according to the third embodiment, the first and second interlayer insulating films 101 and 105 are in contact with each other via the high-strength insulating barrier film 103 in each of the depressed portions 104. Accordingly, the high-strength insulating barrier film 103 serves as a vertically protruding stopper so that a structure resistant to a horizontal stress is formed to suppress the occurrence of the displacement of the films. Even when the first and second interlayer insulating films 101 and 105 have expanded as a result of annealing, the deformation of the first and second interlayer insulating films 101 and 105 can be prevented since the first and second interlayer insulating films 101 and 105 are covered with the high-strength insulating barrier film 103. This allows the suppression of the delamination of the insulating films. As a result, it becomes possible to suppress the occurrence of the displacement of the multilayered films and the delamination of the multilayered insulating films and prevent a faulty interconnection resulting from film displacement or film delamination, such as a short circuit between the interconnections.

FIGS. 8A to 8D and FIGS. 9A to 9D show the cross-sectional structures of the semiconductor device according to the third embodiment in the individual steps of the fabrication method therefor. The description of the components shown in FIGS. 8A to 8D and FIGS. 9A to 9D which are the same as shown in FIGS. 2A to 2D and FIGS. 3A to 3D will be omitted by retaining the same reference numerals.

Figure 8A:
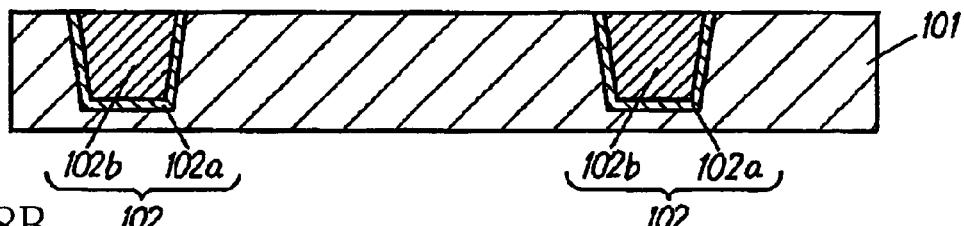
FIGS. 8A to 8D are cross-sectional views illustrating the individual steps of fabricating the semiconductor device according to the third embodiment in the order they are performed.

First, as shown in FIG. 8A, the first interconnections 102 are buried in the first interlayer insulating film 101 formed on the substrate (not shown) in the same manner as in the first embodiment.

Figure 8B:
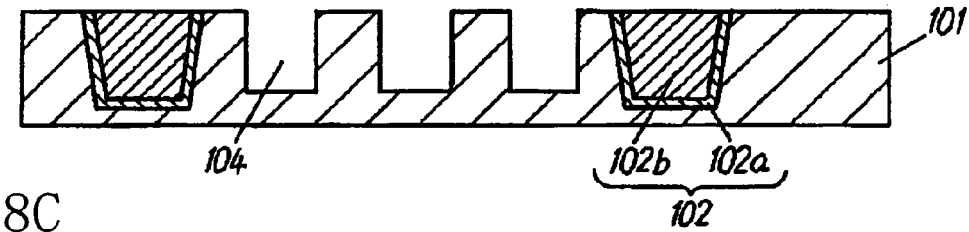

Next, as shown in FIG. 8B, a resist pattern (not shown) having a width of, e.g., 0.09 μm to 5 μm and a spacing of 0.09 μm to 5 μm is formed by photolithography on the first interlayer insulating film 101. Then, by using the resist pattern as a mask, dry etching is performed with respect to the first interlayer insulating film 101, thereby forming the depressed portions 104 each at a depth of 250 nm.

Figure 8C:
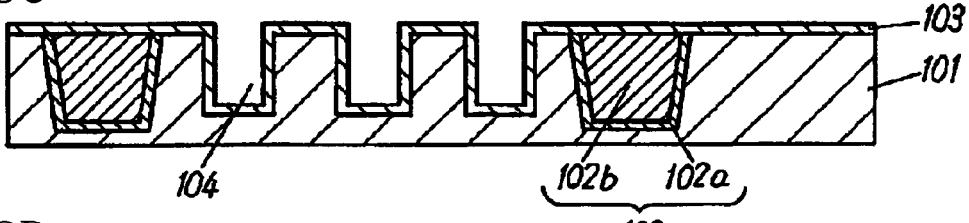

Next, as shown in FIG. 8C, the insulating barrier film 103 for preventing the diffusion of Cu, which is composed of, e.g., a SiC film with a thickness of about 50 nm, is deposited on the first interlayer insulating film 101 including the first interconnections 102 to cover the depressed portions 104.

Figure 8D:
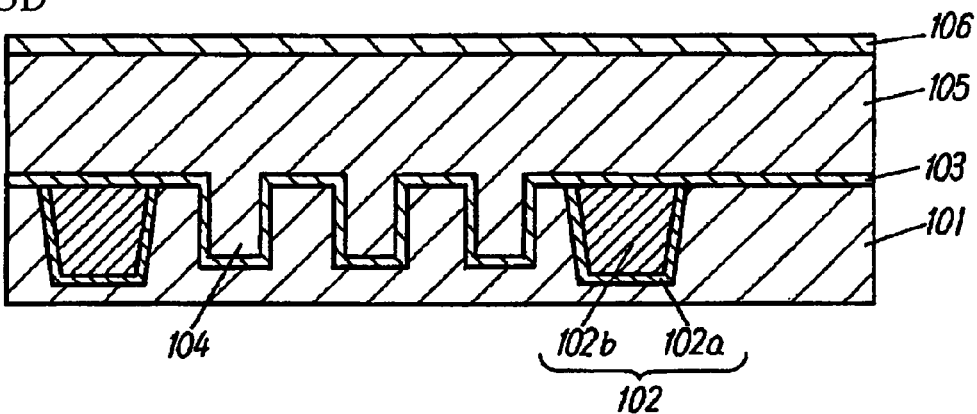
Figure 9A:
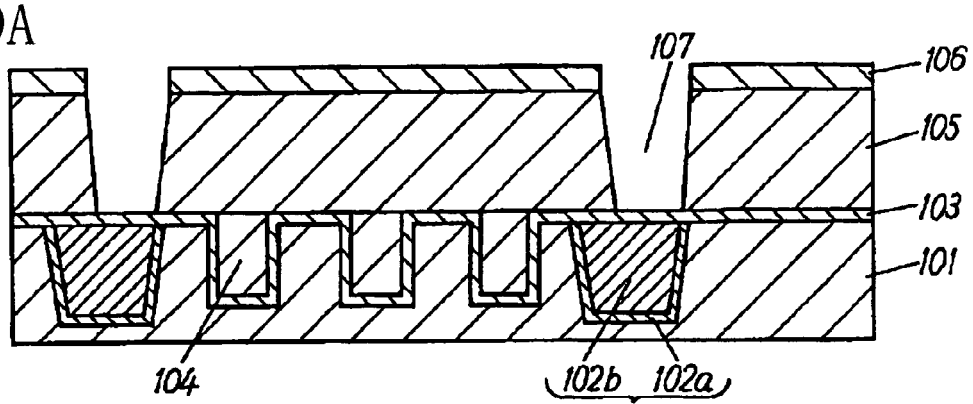
FIGS. 9A to 9D are cross-sectional views illustrating the individual steps of fabricating the semiconductor device according to the third embodiment in the order they are performed.
Figure 9B:
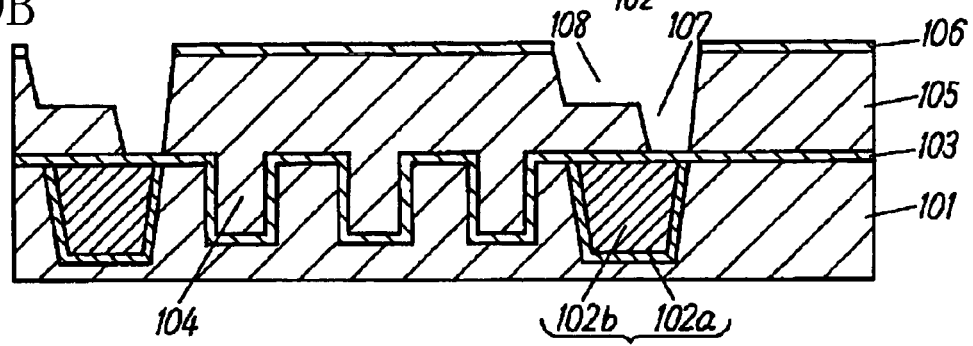
Figure 9C:
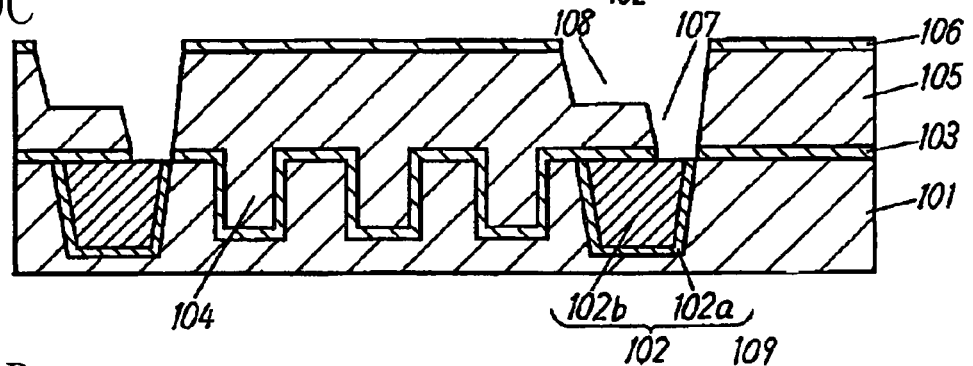
Figure 9D:
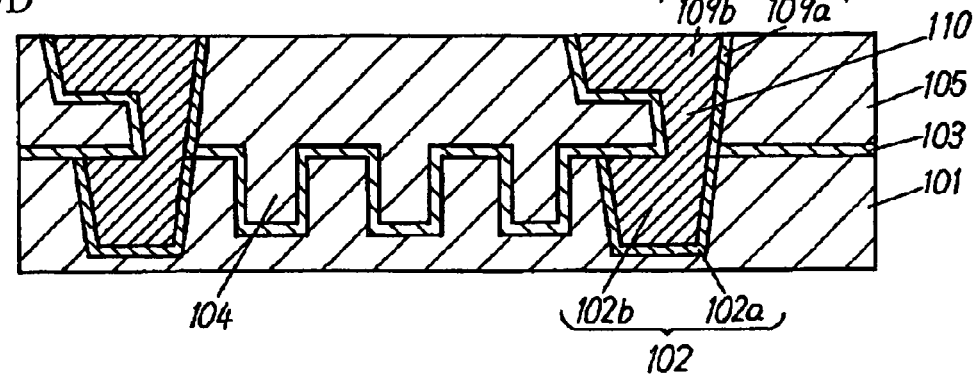

Next, as shown in FIG. 8D, the second interlayer insulating film 105 is deposited on the insulating barrier film 103 to have a thickness of about 1000 nm and fill in the depressed portions 104. Subsequently, the second interlayer insulating film 105 is polished by CMP by a thickness of about 400 nm to be planarized such that a level difference resulting from the depressed portions 104 is reduced (not shown). Thereafter, the cap film 106 composed of, e.g., a $SiO_2$ film is deposited on the second interlayer insulating film 105 to have a thickness of, e.g., 50 nm. As will be described later, the cap film 106 is removed by polishing performed by CMP.

Next, as shown in FIGS. 9A to 9D, the second interconnections 109 and the via plugs 110 are formed in the same manner as in the first embodiment.

By repeatedly performing the individual steps described above, a semiconductor device having Cu interconnections and low dielectric constant films in a multilayer structure is obtained.

Although the third embodiment has shown the width and spacing of the resist pattern for forming the depressed portions 104 and the depth of each of the depressed portions 104, they are not particularly limited and may also be varied for each of the layers. Although the third embodiment has used Cu as the material of each of the first and second interconnections 102 and 109, the type of the material of the interconnection is not particularly limited. Instead of Cu, it is also possible to use, e.g., Cu, Ag, Al, an alloy thereof, or the like.

Although the third embodiment has used the Ta/TaN multilayer film as each of the barrier metal films 102a and 109a, the type of the barrier metal film is not particularly limited. Instead of the Ta/TaN multilayer film, it is also possible to use, e.g., a Ta film, a TaN film, a WN film, a TIN film, a multilayer film thereof, or the like. Although the second embodiment has used the SiC film as the insulating barrier film 103, the type of the insulating barrier film 103 is not particularly limited. Instead of the SiC film, it is also possible to use, e.g., a SiN film, a BCB film, a SiCN film, a CoWB film, or the like.

Although each of the embodiments has shown a structure in which the depressed portions are formed in the regions located between the two first interconnections, the depressed portions need not necessarily be formed in the regions located between the first interconnections. The number of the depressed portions to be formed may be changed appropriately depending on the structure of the semiconductor device. The first interconnections and the second interconnections need not necessarily be connected electrically to each other.

Thus, the semiconductor device according to the present invention and the fabrication method therefor have the effect of implementing a semiconductor device which is less likely to incur a faulty interconnection resulting from the displacement of the multilayered insulating films and film delamination, such as a short circuit between the interconnections, and a fabrication method therefor and are therefore useful for a semiconductor device and a fabrication method therefor, particularly for a semiconductor device using copper interconnections and low dielectric constant films and a fabrication method therefor.

What is claimed is:

1. A semiconductor device comprising:
   a first interlayer insulating film formed on a substrate;
   a first interconnection buried in the first interlayer insulating film;
   a second interlayer insulating film formed over the first interlayer insulating film;
   a second interconnection buried in the second interlayer insulating film; and
   an insulating barrier film formed between the first interlayer insulating film and the second interlayer insulating film, and covering the first interconnection; and
   a via plug for providing an electrical connection between the first and second interconnections,
   wherein the first interlayer insulating film has a depressed portion, and the second interlayer insulating film fills in the depressed portion.

2. The semiconductor device of claim 1, wherein the second interlayer insulating film filled in the depressed portion is in contact with the first interlayer insulating film at a bottom surface of the depressed portion and at a sidewall thereof.

3. The semiconductor device of claim 2, wherein
   the insulating barrier film is formed to have a portion thereof overhanging the depressed portion and
   the portion of the insulating barrier film formed to overhang the depressed portion has upper and lower surfaces thereof in contact with the second interlayer insulating film.

4. The semiconductor device of claim 3, wherein the depressed portion has an upper end portion wider than the bottom surface thereof.

5. The semiconductor device of claim 1, wherein the insulating barrier film is formed to cover a bottom surface of the depressed portion and a sidewall thereof.

6. The semiconductor device of claim 1, wherein each of the first and second interlayer insulating films is a low dielectric constant film.

7. The semiconductor device of claim 1, wherein at least one of the first and second interlayer insulating films is a multilayer film composed of a plurality of films, including a low dielectric constant film, which are stacked in layers.

8. The semiconductor device of claim 1, wherein each of the first and second interconnections is composed of a barrier metal film and a copper film.

9. A semiconductor device comprising:
   a first interlayer insulating film formed on a substrate;
   a first interconnection buried in the first interlayer insulating film;
   a second interlayer insulating film formed over the first interlayer insulating film;
   a second interconnection buried in the second interlayer insulating film; and
   an insulating barrier film formed between the first interlayer insulating film and the second interlayer insulating film, and covering the first interconnection;
   wherein the first interlayer insulating film has a depressed portion,
   the second interlayer insulating film fills in the depressed portion, and
   each of the first and second interconnections is composed of a barrier metal film and a copper film.

10. The semiconductor device of claim 9, wherein the second interlayer insulating film filled in the depressed portion is in contact with the first interlayer insulating film at a bottom surface of the depressed portion and at a sidewall thereof.

11. The semiconductor device of claim 10, wherein
the insulating barrier film is formed to have a portion thereof overhanging the depressed portion, and
the portion of the insulating barrier film formed to overhang the depressed portion has upper and lower surfaces thereof in contact with the second interlayer insulating film.

12. The semiconductor device of claim 11, wherein the depressed portion has an upper end portion wider than the bottom surface thereof.

13. The semiconductor device of claim 9, wherein the insulating barrier film is formed to cover a bottom surface of the depressed portion and a sidewall thereof.

14. The semiconductor device of claim 9, further comprising a via plug for providing an electrical connection between the first and second interconnections.

15. The semiconductor device of claim 9, wherein each of the first and second interlayer insulating films is a low dielectric constant film.

16. The semiconductor device of claim 9, wherein at least one of the first and second interlayer insulating films is a multilayer film composed of a plurality of films, including a low dielectric constant film, which are stacked in layers.

* * * * *